United States Patent [19]
Doki et al.

[11] Patent Number: 5,183,777
[45] Date of Patent: Feb. 2, 1993

[54] METHOD OF FORMING SHALLOW JUNCTIONS

[75] Inventors: Masahiko Doki, Sagamihara; Michiko Takei, Kawasaki, both of Japan

[73] Assignee: Fujitsu Limited, Kawasaki, Japan

[21] Appl. No.: 759,767

[22] Filed: Sep. 13, 1991

Related U.S. Application Data

[63] Continuation of Ser. No. 629,174, Dec. 19, 1990, abandoned, which is a continuation of Ser. No. 290,951, Dec. 28, 1988, abandoned.

[30] Foreign Application Priority Data

Dec. 30, 1987 [JP] Japan .................. 62-335720
Apr. 28, 1988 [JP] Japan .................. 63-104018
Jul. 8, 1988 [JP] Japan .................. 63-171359

[51] Int. Cl.$^5$ .................. H01L 21/00; H01L 21/02; H01L 21/225; H01L 21/265
[52] U.S. Cl. .................. 437/160; 437/141; 437/225; 437/228; 437/950; 148/DIG. 34; 148/DIG. 37; 148/DIG. 144
[58] Field of Search .................. 437/160, 161, 162; 148/DIG. 30, DIG. 34, DIG. 37

[56] References Cited

U.S. PATENT DOCUMENTS

| | | | |
|---|---|---|---|
| 4,382,099 | 5/1983 | Legge et al. | 427/34 |
| 4,542,580 | 9/1985 | Delivorias | 437/162 |
| 4,589,936 | 5/1986 | Komatsu | 437/162 |
| 4,619,036 | 10/1986 | Havemann et al. | 427/53.1 |
| 4,621,411 | 11/1986 | Havemann et al. | 148/DIG. 91 |
| 4,703,551 | 11/1987 | Szluk et al. | 437/30 |

FOREIGN PATENT DOCUMENTS

| | | | |
|---|---|---|---|
| 0070756 | 6/1977 | Japan | 437/160 |
| 0023468 | 2/1979 | Japan | 437/160 |
| 0138974 | 7/1985 | Japan | 437/160 |
| 0013026 | 1/1987 | Japan | 437/30 |

OTHER PUBLICATIONS

Shibata, K., Reduced Pressure deposited arsenic-doped silicon film and its properties as a diffusion source, J. Appl. Phys. 54(2), Feb. 1983, pp.1086-1094.

Sameshima, T., Laser-Induced Melting of Predeposited Impurity Doping Technique used to Fabricate Shallow Junctions, Jour. of Appl. Phys. vol. 62, No. 2, 1987, pp. 711-713.

Usui, S., XeCl Excimer Laser-Doping of Silicon Using Phosphorus and Boron Film as a Diffusant Source, Japan, Jour. of Appl. Phys., 18th Int. Conf. on Solid State Devices and Materials, Aug. 1986, pp. 225-228.

Parekh, P., Arsenic-Doped Polycrystalline Silicon Film for Bipolar Integrated Circuits, Solid State Electronics, vol. 20, 1977, pp. 883-889.

Extended Abstracts of the 19th Conference on Solid State Devices and Materials, Tokyo, Aug. 25-27, 1987, pp. 319-322; B. Mizuno et al: "Plasma Doping into the Side-Wall of a Sub-0.5 μm Width Trench".

International Electron Devices Meeting, Dec. 7-10, 1986, Los Angeles, pp. 58-61, IEEE, New York; R. Liu (List continued on next page.)

*Primary Examiner*—Brian E. Hearn
*Assistant Examiner*—B. Everhart
*Attorney, Agent, or Firm*—Nikaido, Marmelstein, Murray & Oram

[57] ABSTRACT

A method of forming a shallow junction comprises the step of: forming a film including a hydrogen compound with one element selected from the group of boron, phosphorus arsenic to a thickness of several atom layers to 1000 Å on a silicon substrate and annealing the film, whereby an impurity region having a depth of 1000 Å or less and an impurity concentration of $10^{18}$ to $10^{21}$ cm$^{-3}$ is formed in the surface layer of the silicon layer.

11 Claims, 10 Drawing Sheets

OTHER PUBLICATIONS et al: "Mechanisms for Process-Induced Leakage in Shallow Silicided Junctions".

IEEE Electron Device Letters, EDL.8, No. 11, Nov. 1987, pp. 528-530, New York; T. Sugii et al: "Epitaxially Grown Base Transistor for High-Speed Operation".

Journal of Applied Physics, Vol. 62, No. 2, 1987, pp. 711-713, Am. Inst. of Physics, New York; T. Sameshima et al: "Laser-Induced Melting of Predeposited Impurity Doping Technique used to Fabricate Shallow Junctions".

Japanese Journal of Applied Physics, 18th Int. Conf. on Solid State Devices and Materials, Aug. 20-22, 1986, pp. 225-228, Tokyo; S. Usui et al: "XeCl Excimer Laser-Doping of Silicon using Phosphorus and Boron Film as a Diffusant Source".

Solid State Electronics, 1977, vol. 20, pp. 883-889, Great Britain; Parekh: "Arsenic-Doped Polycrystalline Silicon Film for Bipolar Integrated Circuits".

METHOD OF FORMING SHALLOW JUNCTIONS

This application is a continuation of application Ser. No. 629,174, filed Dec. 19, 1990, now abandoned, which is a continuation of application Ser. No. 290,951, filed Dec. 28, 1988, now abandoned.

BACKGROUND OF THE INVENTION

1. Field of the Invention

The present invention relates to a method of forming a shallow junction and a semiconductor device having the shallow junction, and more particularly, it relates to a method of forming a shallow junction in a semiconductor device which has a silicon layer having a thin depth and a high concentration of impurities, and a semiconductor device, e.g., a bipolar transistor and a MOS transistor, having a shallow junction.

2. Description of the Related Art

In general, in a semiconductor device a semiconductor element is formed by providing an impurity diffusion layer in a semiconductor substrate. The impurity diffusion layer is provided by forming, for example, an $SiO_2$ film, on a surface of a semiconductor substrate by a thermal oxidation method, patterning the $SiO_2$ film by photolithography technology, and carrying out a selective thermal-diffusion of impurities or an ion-implantation using the $SiO_2$ film as a mask.

The thermal diffusion process, however, comprises an annealing step at a high temperature, and thus impurities are diffused not only in the depth direction but also in the width direction. Consequently, it is difficult to control the diffusion of the impurities only in the depth direction. Particularly, when for example, an impurity having a large diffusion coefficient, for example, boron (B), is diffused, the impurity diffusion in both the width and depth directions is large, and thus a shallow junction can not be easily formed.

In the ion implanting process, the annealing process required for activating impurities and recovering damage takes a long time, thereby causing a redistribution of the implanted ions and the occurrence of a channeling phenomenon due to a particular crystalline orientation. Consequently, it is also difficult to form a shallow junction by ion-implantation, as it is in the above-mentioned thermal diffusion process.

Further, to reduce the channeling an ion-implanting process wherein ions are implanted at an angle of 7° from the vertical is well known. A shallow portion is still formed, however, near the step portion, for example, the gate electrode portion, and thus it is difficult to stably form an impurity diffusion layer having a depth of 0.1 μm (1000 Å) or less by a conventional thermal diffusion process or ion implanting process.

Conventional examples, e.g., an npn type bipolar transistor having a base region having a high impurity, concentration, i.e., $1 \times 10^{18}$ to $1 \times 10^{21}$ cm$^{-3}$, and a short channel type FET having an LDD (lightly doped drain) to prevent hot carrier effects, will be explained.

First, a conventional npn bipolar transistor and the production process therefor will be explained with reference to FIG. 1.

As shown in FIG. 1, an n+ type buried layer 2 is formed on a p type semiconductor substrate 1, and an n type semiconductor layer 3 acting as a collector is formed thereon.

Subsequently, a p+ type isolation semiconductor layer 4 is formed.

Then, for example, boron ions, are implanted only into a base formation region using a resist mask (not shown) having an opening thereat, to form a base 5, and subsequently, for example, arsenic ions, are implanted into an emitter formation region using a resist mask having an opening thereat to form an emitter 6. In FIG. 1, 8 is a field insulating film and C, B and E are a collector electrode, a base electrode, and an emitter electrode, respectively.

The electric properties of the semiconductor device are represented as follows.

$$\beta = \text{sech}\left(\frac{W_B}{L_{nB}}\right) = 1 - \frac{1}{2}\left(\frac{W_B}{L_{nB}}\right)^2 \quad (a)$$

$$h_{FE} = \frac{\gamma\beta}{1 - \gamma\beta} \quad (b)$$

$$\frac{1}{f_\gamma} = kW_B^2 \quad (c)$$

wherein $\beta$ is a base transportation efficiency, $W_B$: base layer thickness, $L_{nB}$: base diffusion length, $h_{FE}$: emitter ground current amplification ratio, $\gamma$: emitter implanting efficiency, and $f_\gamma$: cut off frequency. Equation (a) shows that, when the base layer thickness $W_B$ is narrowed, the base transportation efficiency $\beta$ becomes large, and equation (b) shows that, when the base transportation $\beta$ becomes large, the emitter ground current amplification ratio $h_{FE}$ becomes large. Further, equation (c) shows that, when the base layer thickness $W_B$ is narrowed, the cut off frequency $f\gamma$, which represents an operating frequency limit of a transistor, becomes high. Therefore, it is very important to narrow the base layer thickness $W_B$ to improve the properties of a semiconductor. A decrease of the ion implanting acceleration energy for impurity ions has been considered as a method of narrowing the base layer thickness $W_B$, but in this case, channeling occurs, and as shown in FIG. 2 by a curve p, the base layer thickness is diffused into the inner portion of a semiconductor substrate. Therefore, to form a base layer having a thickness of 2000 to 3000 Å or less is difficult in practice. The curves Q and R show the impurity concentration distribution in an emitter region and a collector region, respectively.

Next, a conventional FET having LDD will be explained with reference to FIG. 3.

In FIG. 3, 11 is an n type silicon layer such as an n type silicon substrate or n type silicon epitaxial layer, etc., 12 an $SiO_2$ layer acting as an isolation region, 13 a gate insulating film having a thickness of 200 Å, e.g., an $SiO_2$ layer, 14 a gate electrode of polycrystalline silicon layer, 16 and 17 p+ source and drain regions, and 18 and 19 p− regions having an LDD.

Since the voltage used in a semiconductor device is generally constant, regardless of the size of the element, the carrier speed is increased near a drain region in a short channel FET, and a hot carrier effect is generated, and thus the insulation between a gate electrode and a drain might be broken. This phenomenon is particularly remarkable in an n channel type FET having electron carriers, but the same phenomenon can be recognized even in a p channel type FET.

The above-mentioned LDD was developed to prevent the hot carrier effect. Namely, as shown in FIG. 3, a low impurity concentration region (LDD) 19 is formed between a drain 17 and channel to lower the electric field strength, and thus prevent the hot carrier effect.

Although the LDD region preferably has a thickness of 1000 Å or less, i.e. is thin when boron arsenic, and phosphorus, etc., are ion-implanted to form the LDD region, an LDD region having a thickness of 2500 Å or less can not be easily formed due to the channelling, etc. The LDD region can be also formed by forming a boron oxide film using a thermal CVD process or plasma CVD process except for an ion implanting process and carrying out a heat treatment.

When using the thermal CVD process, however, a stacking fault is generated, and when using the plasma CVD process, etching rate of BSG is smaller than that of $SiO_2$, and thus the process is not improved.

SUMMARY OF THE INVENTION

An object of the present invention is to provide a method of forming a shallow junction by forming a impurity diffusion layer having a thickness of 1000 Å or less and an impurity concentration of $10^{18}$ to $10^{21}$ cm$^{-3}$ without damaging the silicon layer.

A further object of the present invention is to provide a semiconductor device having a shallow junction, such as a bipolar transistor and MOS transistor, in which a channeling effect is prevented.

Accordingly, there is provided a method of forming a shallow junction comprising the steps of:

forming a film including a hydrogen compound with one element selected from the group of boron, phosphorus and arsenic with to a thickness from several atom layers to 1000 Å on a silicon substrate and annealing the film, whereby an impurity region having a depth of 1000 Å or less and having an impurity concentration of $10^{18}$ to $10^{21}$ in the surface layer of the silicon layer is obtained.

According to the present invention, the thickness of the film including the hydrogen compound with one element selected from the group of boron (B), phosphorus (P) and arsenic (As) is preferably from several atom layers to 200 Å to obtain a shallower junction.

The annealing is preferably carried out by furnace annealing at 800° to 950° C. or by a lamp annealing at 1000° C. to 1150° C.

According to the present invention there is further provided a method of producing an npn type bipolar transistor having a shallow junction, comprising the steps of, forming a film including a hydrogen compound with one element selected from the group of boron phosphorus and arsenic on a first conductivity type silicon layer acting as a collector, annealing the film and the silicon layer to diffuse the one element included in the film into the n type silicon so that a base having a thickness of 1000Å or less is formed, and forming an emitter of a silicon layer containing said first conductivity type impurities on a part of the base.

Still further, there is provided a method of producing a MOS transistor having a shallow source and drain, comprising the steps of:

forming a gate insulating layer and a gate electrode on a first conductivity type silicon layer, forming a film including a hydrogen compound with one element selected from the group of boron, phosphorus and arsenic on said first conductive type silicon layer, conductivity annealing the film and said first type silicon layer to diffuse the one element selected from the group of boron, phosphorus and arsenic into said silicon layer, whereby a second conductivity type silicon layer having a thickness of 1000 Å or less and an impurity concentration of $10^8$ to $10^{21}$ cm$^{-3}$ is formed in said first conductivity type silicon layer, forming a drain formation mask at the side wall of the gate electrode, and introducing a second conductivity type impurity into the first conductivity type silicon layer using both the gate electrode and the side wall thereof as a mask.

Further, according to a present invention there is provided a bipolar transistor comprising a shallow base silicon layer having a thickness of 1000 Å or less and having an impurity concentration of $10^{18}$ to $10^{21}$ cm$^{-3}$, and a MOS transistor comprising a shallow source and drain silicon layer having a thickness of 1000 Å or less and having an impurity concentration of $10^{18}$ to $10^{21}$ cm$^{-3}$.

DESCRIPTION OF THE PREFERRED EMBODIMENTS

Embodiments of the present invention will be now explained with reference to the accompanying drawings.

Embodiment 1

A method of forming a silicon layer having a thickness of 1000 Å or less and an impurity concentration of $10^{18}$ to $10^{21}$ cm$^{-3}$ will be explained.

Figure 1:
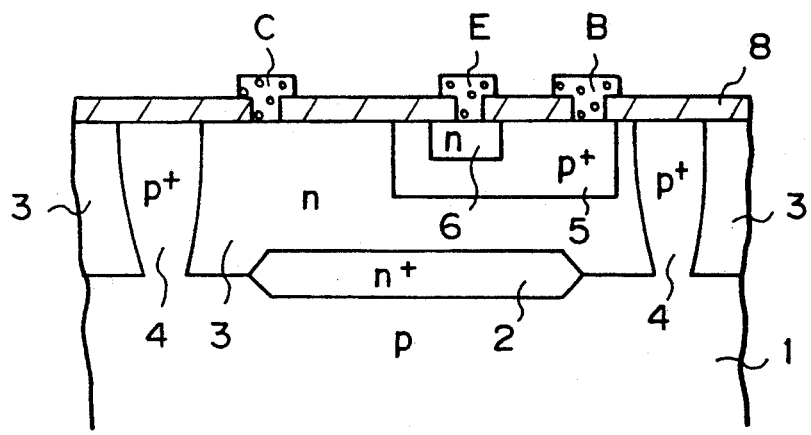
FIG. 1 is a cross-sectional view of a conventional npn bipolar transistor.
Figure 2:
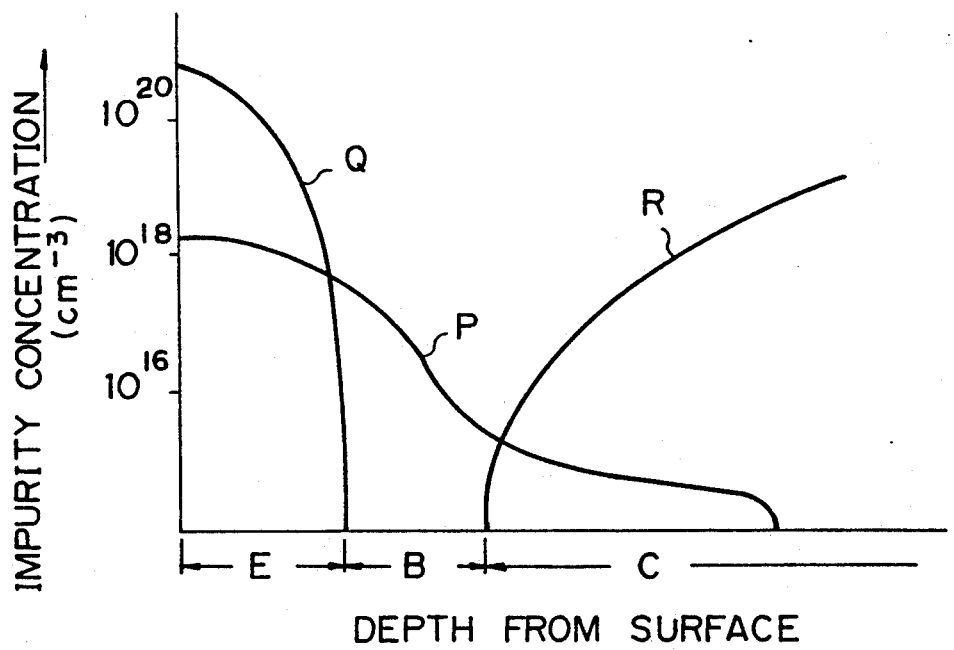
FIG. 2 is a graph illustrating impurity concentration distribution in the emitter (E); base (B) and collector (C) region.
Figure 3:
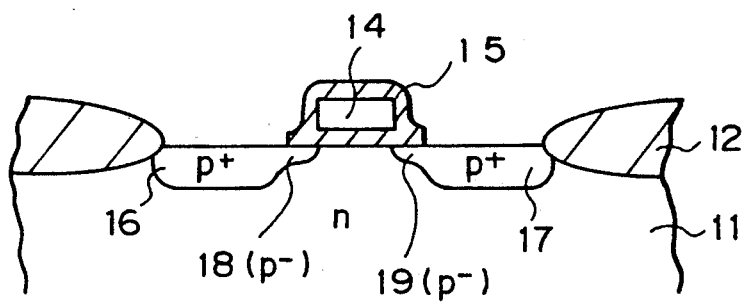
FIG. 3 is a cross-sectional view of a conventional MOS transistor.
Figure 4:
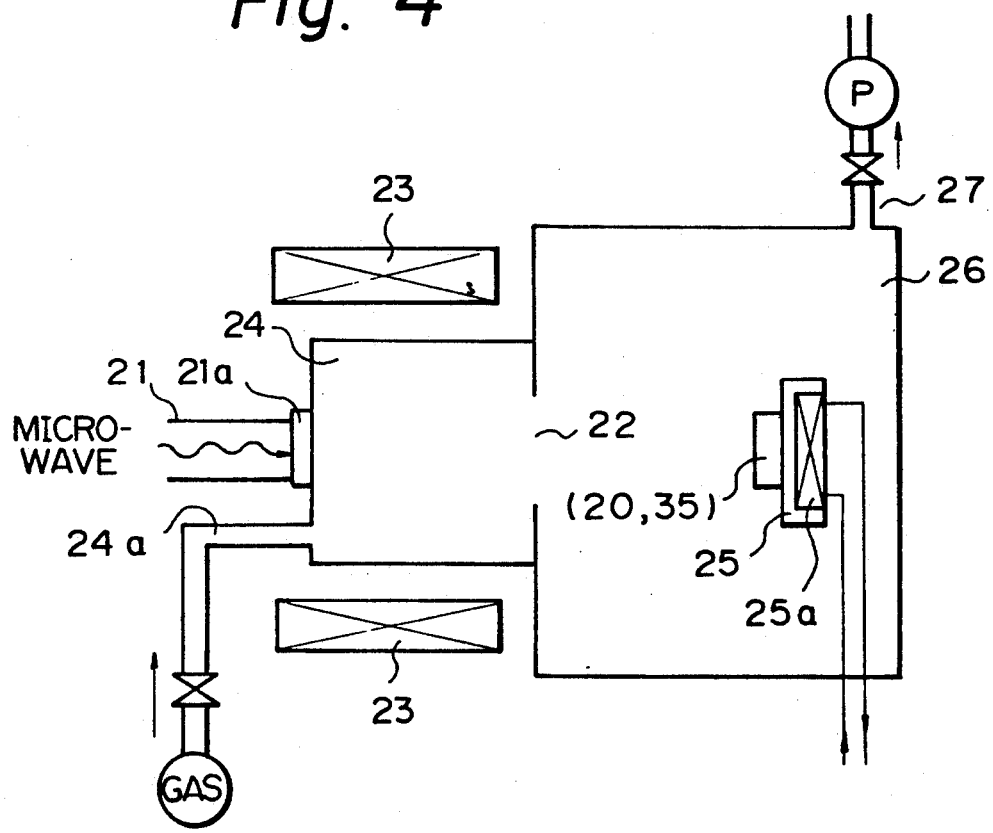
FIG. 4 is a schematic cross-sectional view of a non-bias dispersion magnetic field type electron cyclotron resonance (ECR) plasma CVD device.

FIG. 4 shows a schematic cross-sectional view of a non-bias dispersion magnetic field type Electron Cyclotron Resonance (ECR) plasma CVD apparatus used for forming a thin film of impurity atoms of boron, phosphorus or arsenic according to the present invention.

As shown in FIG. 4, 21 is a wave guide by which an exciting microwave of, for example, 2.45 GHz, is guided. The exciting microwave is introduced into a plasma generating chamber 24 through a microwave introducing window 21a, 23 is a magnetic field generating means for generating plasma which usually provides about 875 gauss. A reactive gas supplied through a gas supply opening 24a is plasmanized by the exciting microwave. The plasma is confined in the plasma generating chamber 24. Reference 26 is a reaction chamber (thin film forming chamber having a plasma feed opening 22 in which a supporting means 25, which supports a silicon substrate 20, is provided. The temperature of the supporting means 25 is controlled by a cooling means 25a. The reaction gas related to the reaction is discharged through an exhaust system 27. No bias voltage is applied against the substrate 20.

Figure 5:
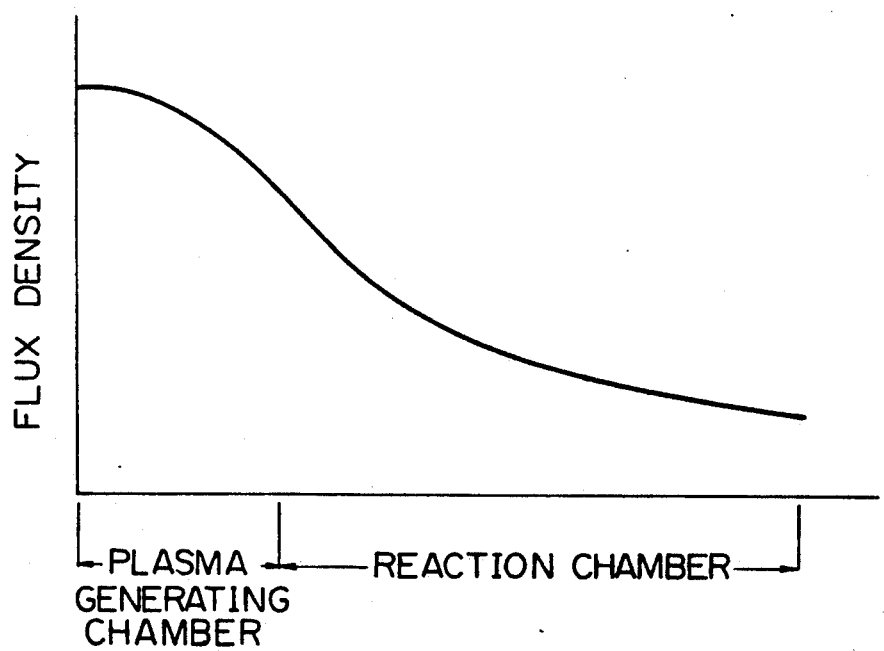
FIG. 5 is a graph of plasma intensity in a plasma generating chamber and reaction chamber.

The feature of the non-bias dispersion magnetic field type ECR plasma CVD apparatus is that, as shown in FIG. 5, the plasma potential intensity is sharply reduced from the left side of the plasma generating chamber 24 to the right side of the reaction chamber 26. The plasma potential of the reactive gas is reduced from 10 to 25 V near the supporting means 25.

When a p type silicon layer is formed by diffusing p type impurities, a mixed gas of $B_2H_6$ and an inactive gas such as Ar, He, $H_2$, is used as the reacting gas. On the other hand, when an n type silicon layer is formed by diffusing n type impurities, a mixed gas of $pH_3$ and inactive gas, for example, Ar, He, $H_2$ r $AsH_3$, is used as a reacting gas.

The concentration of an active layer can be controlled by controlling the source gas concentration, film growth time, and annealing temperature, etc.

Figure 6A:
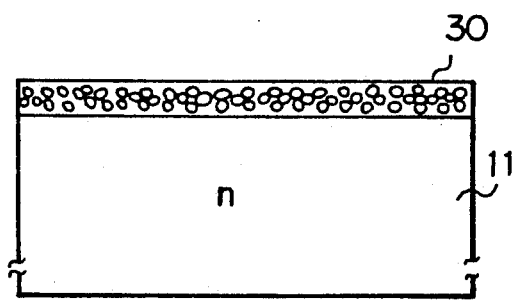
FIG. 6A is a cross-sectional view of a thin film on a silicon substrate according to the present invention.

After the silicon substrate 20 is supported on the supporting means 25, the above-mentioned reacting gas is supplied so that the internal pressure of the reaction chamber 26 becomes 0.1 to 0.2 Pa. Then when the above-mentioned magnetic field and exciting microwave are applied, boron, phosphorus or arsenic, etc., is deposited on the silicon substrate 20. Since the energy having atoms of boron phosphorus or arsenic, etc., is 10 to 20 V, which is extremely low, the temperature of the silicon substrate 20 is 150° C. or less. Therefore, boron, phosphorus or arsenic is deposited on the silicon substrate 20 without damage as an extremely thin film having thickness of the atom layer order as shown in FIG. 6A.

Figure 6B:
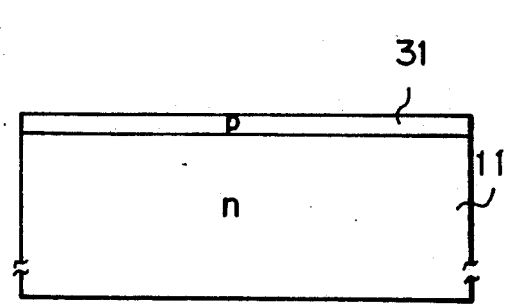
FIG. 6B is a cross-sectional view explaining a thin silicon substrate according to the present invention.

After the thin film of boron, phosphorus or arsenic is formed, vacuum annealing is carried out at a temperature of 900° C. or less under a vacuum, and the boron, phosphorus or arsenic of the boron, phosphorus or arsenic thin film is diffused to a region having a thickness of 1000 Å or less, whereby a p (or n) type silicon layer having a thickness of 1000 Å or less and containing an impurity concentration of $10^{18}$ to $10^{21}$ cm$^{-3}$ is formed as shown in FIG. 6B.

Embodiment 2

A method of producing an LDD FET (Lightly Doped Drain Field Effect Transistor) having a silicon layer obtained in the first embodiment will be explained with reference to FIGS. 7A to 7F.

Figure 7A:
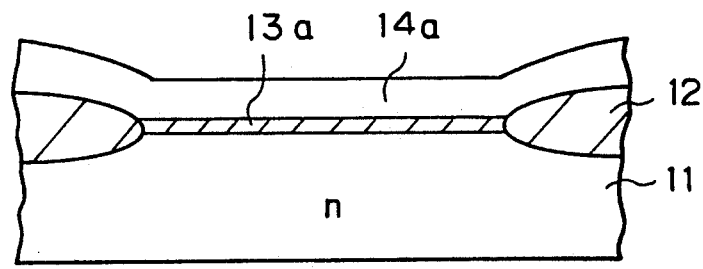
FIGS. 7A to 7F are cross-sectional views explaining a method of producing a MOS transistor according to the present invention.

As shown in FIG. 7A, a thick $SiO_2$ layer 12 is formed at an isolation region of a surface of an n type silicon layer 11 using a LOCOS process. Then, using a CVD process, an $SiO_2$ layer 13a having a thickness of 100 to 200 Å is formed on the silicon layer 11.

Subsequently, a polycrystalline silicon layer 14a having a thickness of 5000 Å is formed.

Figure 7B:
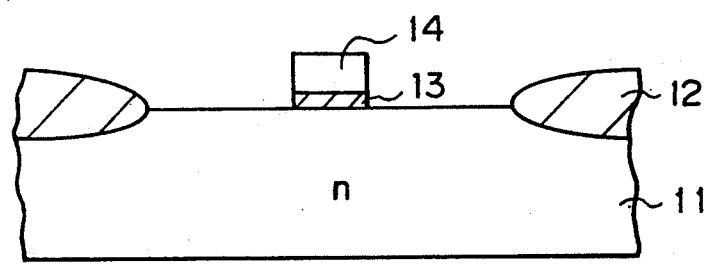

Then, as shown in FIG. 7B, the stack of the $SiO_2$ layer 13a and the polycrystalline silicon layer 14a is patterned so that a gate insulating film 13 and a gate electrode 14 are formed.

Figure 7C:
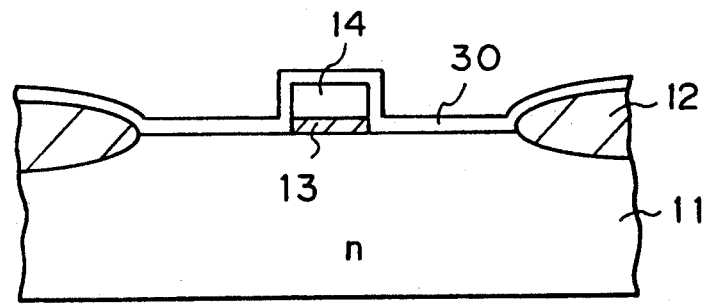

Subsequently, as shown in FIG. 7C, a boron layer 30 having a thickness of 1000 Å or less is formed by an ECR plasma CVD process using a reacting gas of $B_2H_6$ and an inactive gas, for example, Ar, He, and $H_2$ as explained in Example 1. The microwave wavelength used for forming the boron layer 30 is, for example, 2.45 GHz, and the magnetic field intensity is 875 gauss, the device internal pressure is 0.1 to 0.2 Pa and the deposition time is about 20 secs when the microwave power is 200 to 1 kW.

Figure 7D:
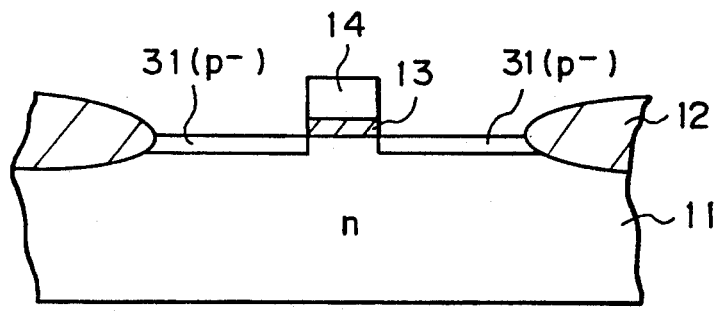

As shown in FIG. 7D, when vacuum annealing is carried out for about 30 mins in a nitrogen atmosphere at a temperature of 900° C. or less, boron phosphorus or arsenic of the boron, phosphorus or arsenic thin film 30 is diffused to a region having a thickness of 1000 Å or less, and a p type (or n type) region 31 having a p type (or n type) impurity concentration of $10^{19}$ cm$^{-3}$ is formed.

Figure 7E:
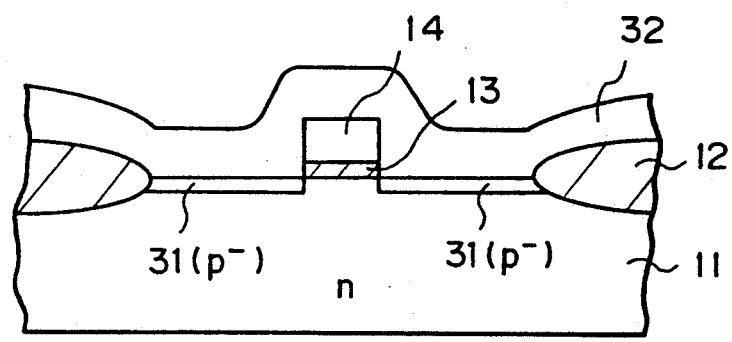

Then, as shown in FIG. 7E, an $SiO_2$ layer 32 having a thickness of about 3000 Å is formed by using a well known CVD process.

Figure 7F:
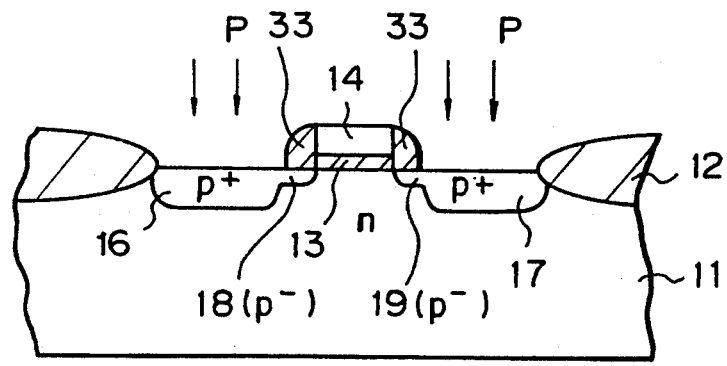

Subsequently, as shown in FIG. 7F, the $SiO_2$ layer 32 is etched by a reactive ion etching (RIE) process so that an $SiO_2$ layer 33 remains at the side wall of the gate electrode 14.

Then, $BF_2$ or B is ion implanted at an implanting pressure of about 40 keV and a dosage of about $3 \times 10^{15}$ cm$^{-2}$, and subsequently, annealing is carried out at a temperature of 900° C. in a nitrogen atmosphere so that a p$^+$source 16 and p$^+$drain 17 are formed. In this ion implanting process, the p type region 30 covered by the $SiO_2$ layer 33 becomes the LDD's 18 and 19.

Accordingly, an field effective transistor (FET) provided with LDD's 18 and 19 having an impurity concentration of about $10^{19}$ cm$^{-3}$ and a thickness of 1000 Å or less is obtained. The LDD's 18 and 19 act as a shallow junction.

Embodiment 3

A method of producing a bipolar transistor having a shallow junction will be explained with reference to FIGS. 8a to 8E.

Figure 8A:
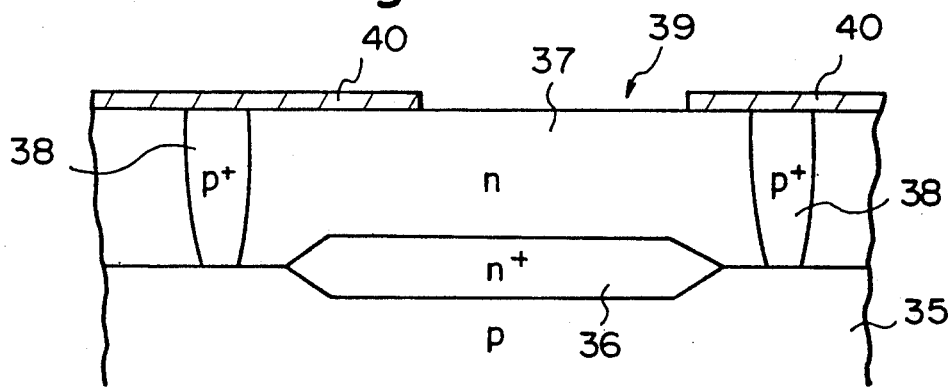
FIGS. 8A to 8E are cross-sectional views explaining a method of producing a bipolar transistor according to the present invention.

As shown is FIG. 8A, an n$^+$ type buried layer 36 is formed on a p type silicon substrate 35 and an n type silicon single crystalline layer 37 is formed thereof. After introducing p type impurities to an isolation region a p$^+$ type silicon isolation layer 38 is formed.

Then, by thermally oxidizing the surface thereof, an $SiO_2$ film is formed. After removing a part of the $SiO_2$ film, a base formation mask 40 having an opening 39 is formed at a base formation region mask 40.

The obtained silicon substrate 35 is then set on the support means 25 as shown in FIG. 4. The pressure in the plasma generating chamber 24 and the reaction chamber 26 is maintained at $6 \times 10^{-3}$ Torr or less, and the cooling means 25a is controlled so that a temperature of 20° C. to 150° C. is maintained. Further, a bias voltage is not applied to the silicon substrate 35.

Argon gas containing 1 to 5% of diborane ($B_2H_6$) is fed into the plasma generating chamber having a volume of $8.5 \times 8.5 \times \pi \times 19$ cm$^3$ or 5.71, at a supply rate of about 30 cc/min, and a microwave having a power of 200 to 800W and a frequency of 2.45 GHz is introduced to the plasma generating chamber 24 through the microwave introduction window 21a.

Figure 9:
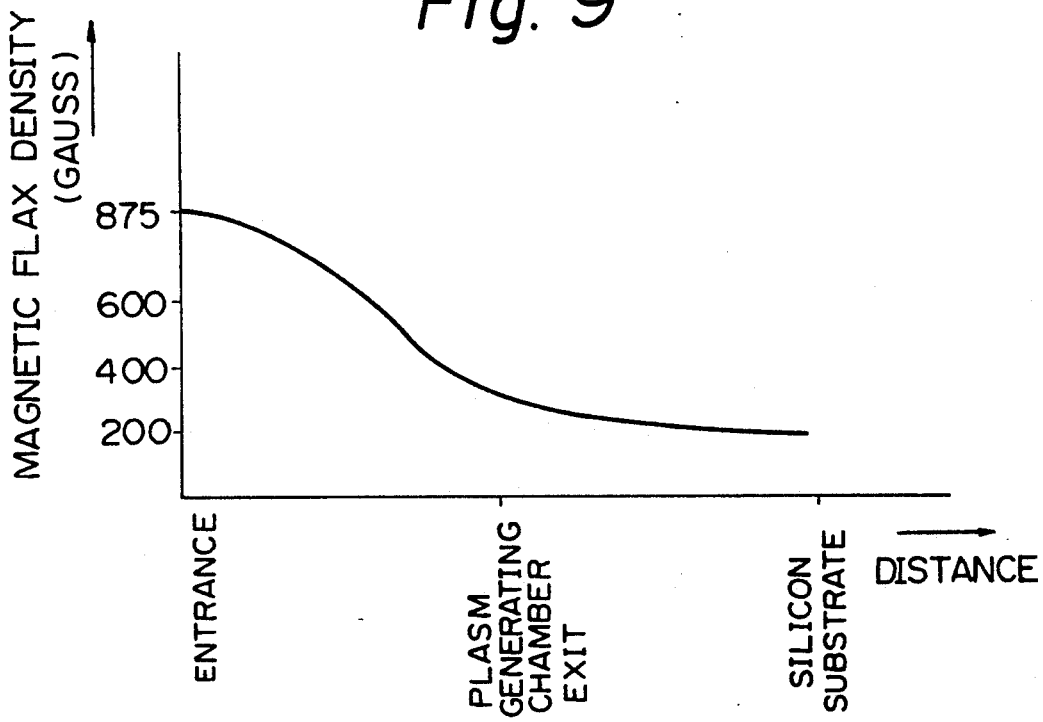
FIG. 9 is a graph illustrating the magnetic flux density in any ECR plasma CVD device according to the present invention.

In the above-mentioned processed, a dispersion type magnetic field formed by the dispersion type formation means 23 is generated as shown in FIG. 9.

Namely, the magnetic flux density is about 875 gauss at the entrance side of the plasma generating chamber 24, and is about 300 gauss near the plasma feed opening 22. Therefore, as shown in FIG. 9, the magnetic flux density is gradually reduced. Consequently, $B_2H_6$ supplied from the gas supply opening 24a is excited and the excited boron, i.e., boron atoms, boron radicals or boron ions, is moved to the reaction chamber 26 together with plasma generated in the plasma generating chamber 24.

Figure 8B:
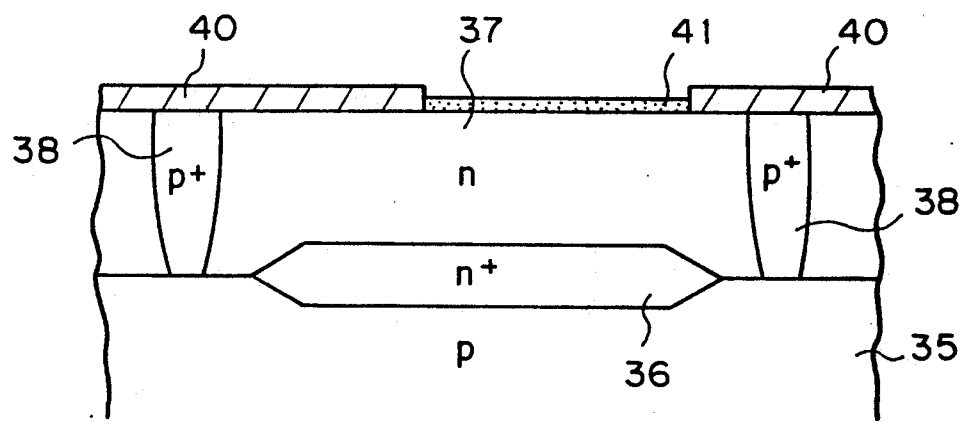

After the translation of the excited boron is completed, it collides with the silicon substrate 35 at a low speed, which is accelerated by a low accelerated energy, e.g., about 20V, so that a boron thin film 41 having a thickness of several hundreds is formed on a base formation region of the silicon substrate as shown in FIG. 8B. The time required to form the boron film is from several seconds to several minutes. The boron thin film 41 is non-metallic and atomic.

Figure 8C:
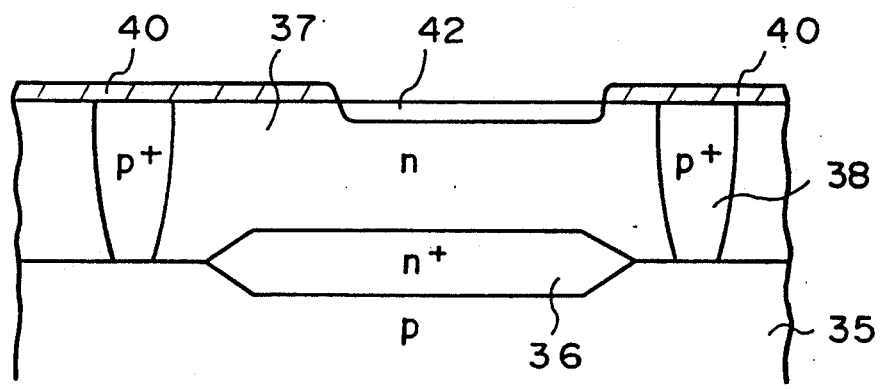

The obtained silicon substrate 35 is annealed at a temperature of 800° C. to 900° C. for about 30 minutes under a nitrogen or hydrogen gas atmosphere and a reduced pressure of 1 to 4 Torr, whereby an improved thin p type base 42 is formed in the n type silicon layer 37 acting as a collector without losing the crystallizability thereof as shown in FIG. 8C. The thickness of the base 42 is 1000 Å or less.

Figure 8D:
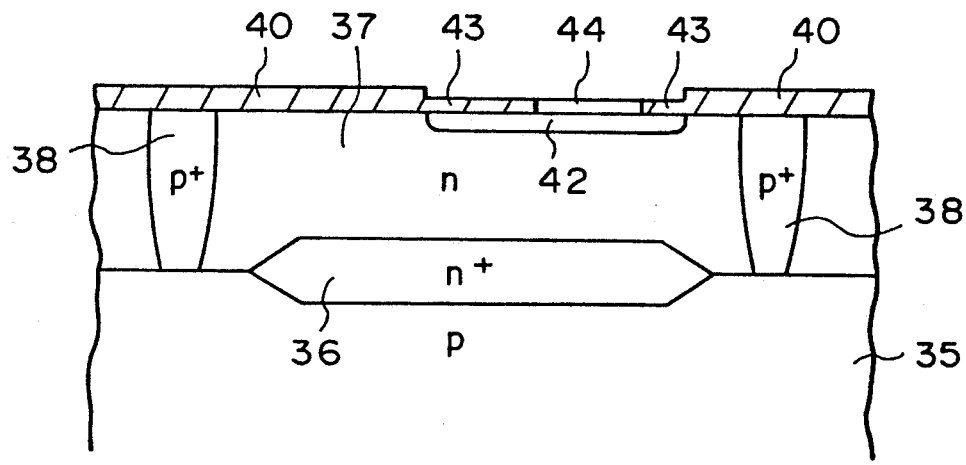

Then, as shown in FIG. 8D, an $SiO_2$ film is formed on a base 42 and a part of the $SiO_2$, corresponding to an emitter formation region is removed so that a emitter formation mask 43 is formed. After a polycrystalline silicon film is formed on only the emitter region 44, n type impurities are implanted into the polycrystalline silicon film to form an emitter 44.

Figure 8E:
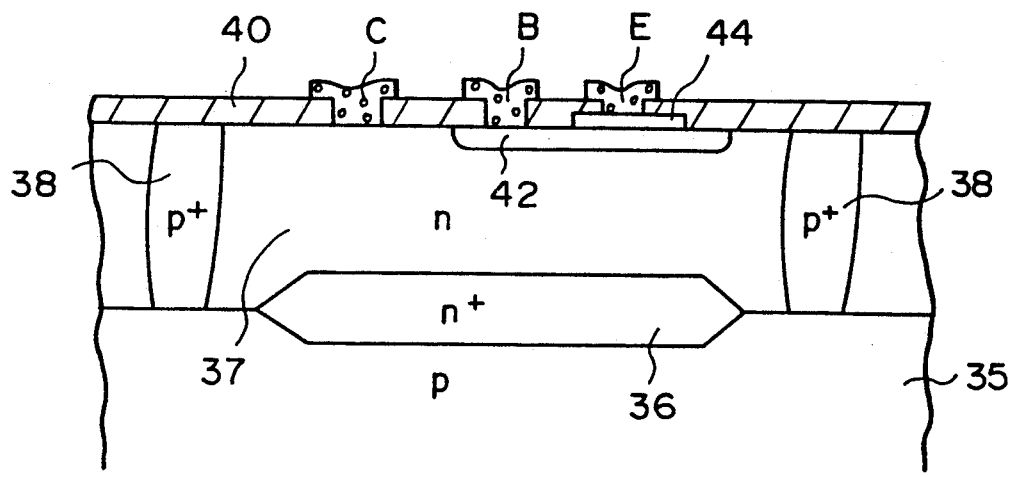

Then, as shown in FIG. 8E, a $SiO_2$ film is formed on the emitter 44, and electrode contact windows are formed in the collector electrode formation region, the base electrode formation region, and the emitter electrode formation region, and after forming an aluminum film over the entire surface, patterned so that a collector electrode C, a base electrode B and an emitter electrode E are formed, whereby a shallow base type bipolar transistor can be realized. Namely, the bipolar structure has a shallow junction.

Figure 10:
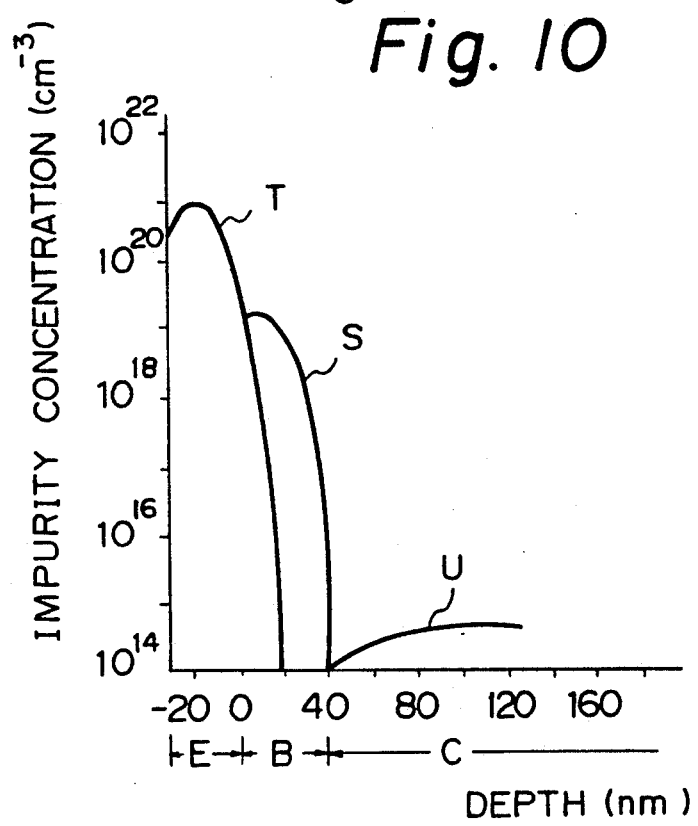
FIG. 10 is a graph illustrating an impurity concentration profile of a shallow base type bipolar transistor according to the present invention.

FIG. 10 shows an impurity concentration profile of a shallow base type bipolar transistor produced by above-explained processes.

In FIG. 10, the curve S is an impurity concentration profile of a base. In this embodiment, the base width (thickness) is 40 nm and the impurity concentration of the base is $3 \times 10^{19}$ cm$^{31}$ $^3$. The curve T is an impurity concentration profile of an emitter layer formed on the base, and the curve U is an impurity concentration profile of a collector.

Figure 11:
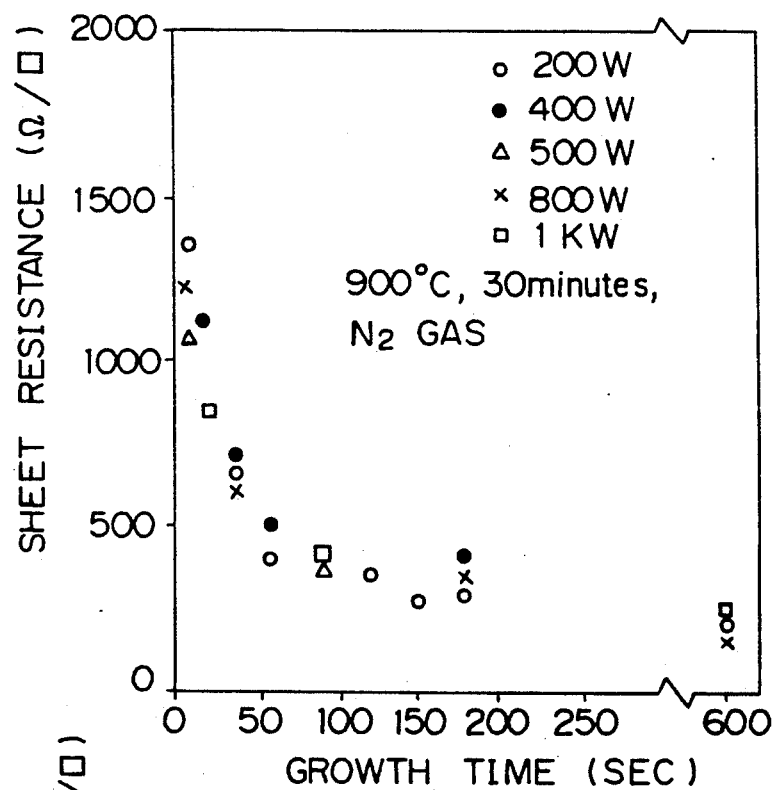
FIG. 11 is a graph illustrating a relationship between a sheet resistance ($\Omega/\square$) in which a microwave power is changed from 200 W to 1 kW and a growth time (sec)

FIG. 11 is a graph showing a relationship between a sheet resistance $\rho_S(\Omega/\square)$ in which a microwave power is changed from 200 W to 1 kW and a growth time (sec). In the growth process, a heat treatment was carried out at 900° C. for 30 minutes under an $N_2$ atmosphere at a reduced pressure. This graph shown that the sheet resistance does not depend on the microwave power.

Figure 12:
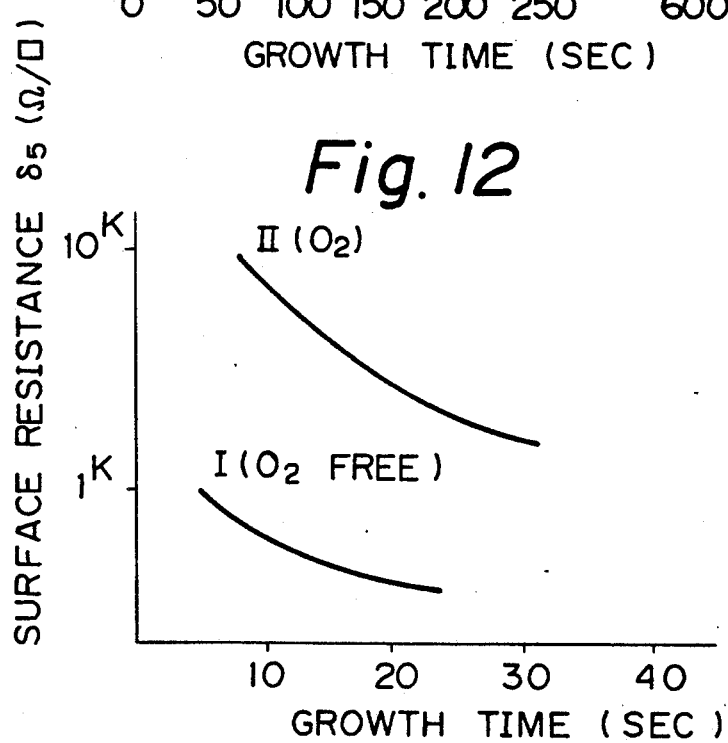
FIG. 12 is a graph illustrating a relationship between the surface resistance $\rho_X$ ($\Omega/\square$) and the growth time.

FIG. 12 shows a relationship between the surface resistance $\rho_S (\Omega/\square)$ and the growth time in the absence or presence of oxygen in a plasma generating chamber the curve I is the case in the absence of oxygen and the curve II is the case in the presence of oxygen.

A gas supply of 30 cc/min of Ar gas in which 1% of $B_2H_6$ is contained, and a heat treatment at 900° C. for 30 min under a reduced $N_2$ atmosphere were used as the growth conditions 1 cc of oxygen was added to the gas supply of 300° C. As apparent from FIG. 12 if even a small amount of oxygen is added to the supply gas the surface resistance $\rho_S$ is sharply changed, and thus a diffusion layer having a high concentration of impurities can not be formed.

Figure 13B:
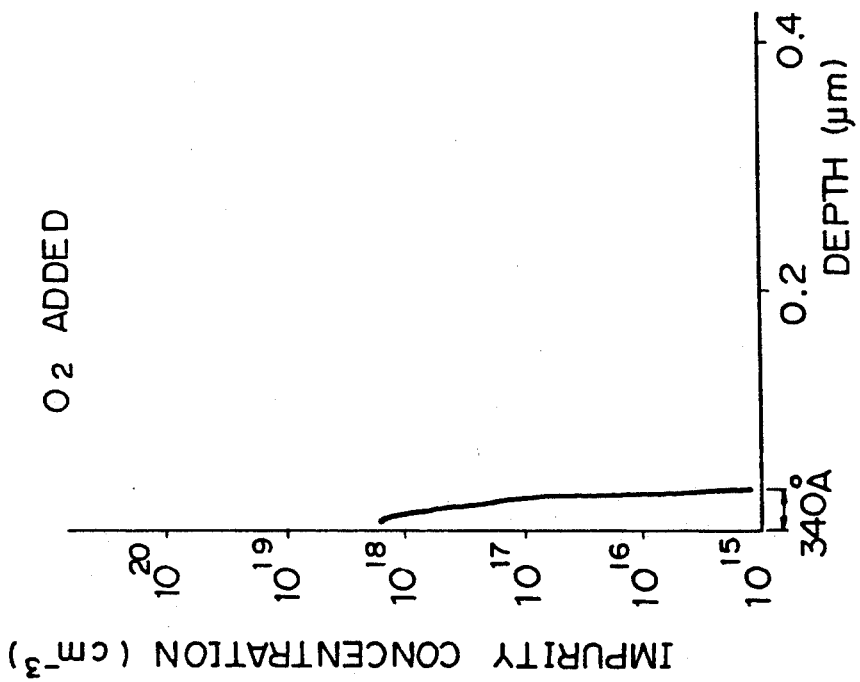
FIGS. 13A and 13B are graphs illustrating an impurity concentration (cm$^{-3}$) in a depth direction obtained by a measurement by an SIMS.
Figure 13A:
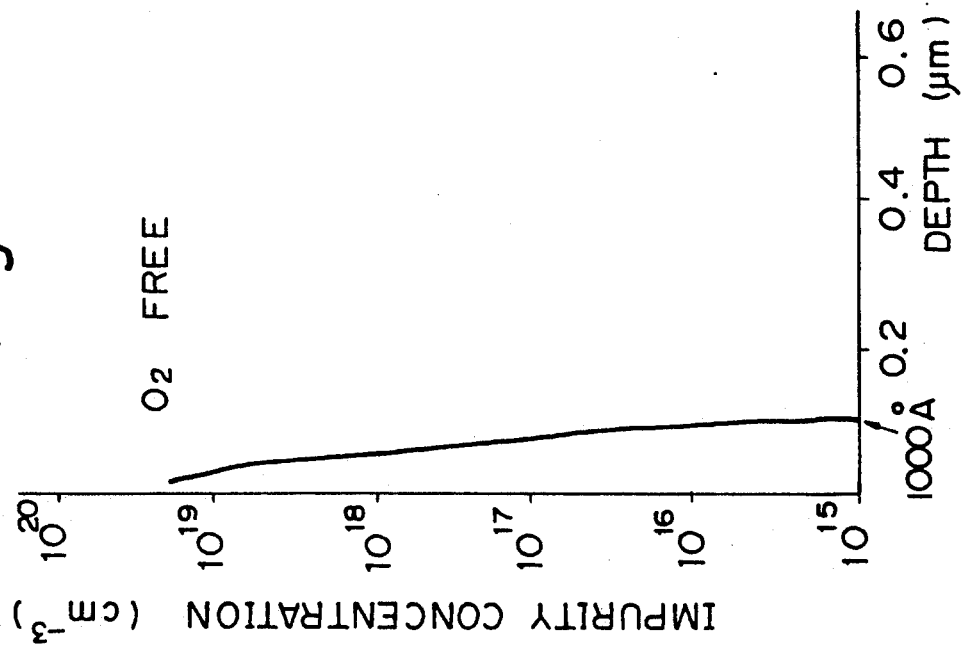

FIGS. 13A and 13B show the impurity concentration (cm$^{-3}$) in a depth direction obtained by a measurement by a secondary ion mass spectroscopy (SIMS). The growth conditions are as follows:

microwave power: 200 W, growth time: 20 sec, gas supply rate: 30 cc of Ar gas in which the 1% of $B_2H_6$ is contained per minutes, heat treatment (annealing): at a temperature of 850° C., for 30 min in an $N_2$ atmosphere under a reduced pressure.

FIG. 13A shows a growth method in an oxygen free atmosphere. In this case, a p type impurity diffusion layer having a surface concentration of $2 \times 10^{19}$ cm$^{-3}$ and a thickness of about 1000 Å is formed. On the other hand, FIG. 13B shows a growth method in an oxygen containing atmosphere, wherein the surface impurity concentration becomes $1 \times 10^{18}$ cm$^{-3}$ and the depth of the impurity region becomes about 340 Å, whereby the surface impurity concentration and the depth of the impurity diffusion layer are remarkably reduced. Further, as shown by the measurement by a SIMS, channeling is not generated.

I claim:

1. A method of forming a shallow junction comprising the steps of:
   forming a film of a hydrogen compound of an element selected from the group consisting of boron, phosphorus and arsenic and having a thickness of from several atom layers to 1000 Å on a silicon layer, without impurities substantially penetrating said silicon layer by depositing said compound at a temperature of up to 150° C. and an accelerating energy of up to 20V; and
   annealing the film under conditions sufficient to form an impurity region having a depth of 1000 Å or less and having an impurity concentration of $10^{18}$ to $10^{21}$ in the surface layer of the silicon layer.

2. A method according to claim 1, wherein the thickness of the film including the hydrogen compound with one element selected from the group of boron, phosphorus and arsenic is from several atom layers to 200 Å.

3. A method according to claim 1, wherein the film including the hydrogen compound with one element selected from the group of boron, phosphorus and arsenic is formed by an electron cyclotron resonance plasma CVD process, at a temperature of 150° C. or less.

4. A method according to claim 1, wherein the hydrogen compound with boron is diborane ($B_2H_6$).

5. A method according to claim 1, wherein the hydrogen compound with phosphorus is phosphine ($PH_3$).

6. A method according to claim 1, wherein the hydrogen compound with arsenic is arsine ($AsH_3$).

7. A method according to claim 1, wherein the annealing is carried out by furnace annealing at 800° C. to 950° C.

8. A method according to claim 1, wherein the annealing is carried out by lamp annealing at 1000° C. to 1150° C.

9. A method according to claim 1, wherein the annealing is carried out at an oxygen partial pressure of $10^{18}$ cm$^{-3}$ or less.

10. A method of producing an npn type bipolar transistor having a shallow junction, comprising the steps of:
forming a film of a hydrogen compound of an element selected from a group consisting of boron, phosphorus and arsenic on a first conductivity type silicon layer acting as a collector, under such conditions, including a temperature of up to 150° C. and an acceleration energy of up to 20V, as not to damage said silicon layer;
annealing the film and the silicon layer to diffuse the one element included in the film into the n type silicon so that a base having a thickness of 1000 Å or less is formed; and
forming an emitter of a silicon layer containing said first conductivity type impurities on part of the base.

11. A method of producing a MOS transistor having a shallow source and drain, comprising the steps of:
forming a gate insulating layer and a gate electrode on a first conductivity type silicon layer;
forming a film of a hydrogen compound of an element selected from the group consisting of boron, phosphorus and arsenic on said first conductivity type silicon layer, under such conditions, including a temperature of up to 150° C. and an acceleration energy of up to 20V, as not to damage said silicon layer;
annealing the film and said first conductivity type silicon layer to diffuse the one element selected from the group consisting of boron, phosphorus and arsenic into said silicon layer, wherein a second conductivity type silicon layer having a thickness of 1000 Å or less and an impurity concentration of $10^8$ to $10^{21}$ cm$^{-3}$ is formed in said first conductivity type silicon layer;
forming a drain formation mask at the side wall of the gate electrode; and
introducing a second conductivity type impurity into the first conductivity type silicon layer using both the gate electrode and the side wall thereof as a mask.

* * * * *